United States Patent
Chen et al.

(10) Patent No.: US 8,963,745 B2
(45) Date of Patent: Feb. 24, 2015

(54) APPARATUS AND SCANNING METHOD FOR KEY INPUT APPARATUS

(75) Inventors: Hsin-Lun Chen, Chupei (TW); Yen-Ting Lee, Chupei (TW)

(73) Assignee: Sonix Technology Co., Ltd., Hsinchu (TW)

( * ) Notice: Subject to any disclaimer, the term of this patent is extended or adjusted under 35 U.S.C. 154(b) by 581 days.

(21) Appl. No.: 13/340,765

(22) Filed: Dec. 30, 2011

(65) Prior Publication Data

US 2013/0076541 A1 Mar. 28, 2013

(30) Foreign Application Priority Data

Sep. 27, 2011 (TW) .............................. 100134884 A

(51) Int. Cl.
*H03M 11/00* (2006.01)

(52) U.S. Cl.
USPC ................................ 341/22; 341/26; 714/813

(58) Field of Classification Search
USPC .................. 341/20, 22, 25, 26; 345/168, 169; 702/108, 118, 35, 120; 714/726, 729, 714/813, 814

See application file for complete search history.

(56) References Cited

U.S. PATENT DOCUMENTS 7,106,304 B2 *  9/2006  Peng et al. .................... 345/168
7,375,655 B2 *  5/2008  Lu .................................. 341/26

* cited by examiner

*Primary Examiner* — Hung T. Nguyen
(74) *Attorney, Agent, or Firm* — Birch, Stewart, Kolasch & Birch, LLP

(57) ABSTRACT

A key input includes a keypad device and a micro controller unit. The keypad device has a matrix consisted of first signals lines, second signal lines, and switches located in corners which are formed by the first and the second signal lines, and a plurality of keys corresponding to the switches. The micro controller unit connects the first signal lines and the second lines and provides a pulse to the first signal line. When the switch is turned on by the key, the pulse is translated from the first signal line to the second signal line. Thus, the pulse is directly detected, so as to achieve the fast scanning and low sensitive impedance of carbon membrane efficient.

11 Claims, 4 Drawing Sheets

APPARATUS AND SCANNING METHOD FOR KEY INPUT APPARATUS

TECHNICAL FIELD

The present invention relates to a key input device and the scanning method thereof, more especially a key input device and the scanning method thereof suitable for different film material.

BACKGROUND

Keypad is the most important input interface of the personal computer and the laptop. Users instruct computer to execute the corresponding action by pressing different keys. Generally, according to the structure of the key of the keypad, there are two kinds of keypad, mechanical and film. The film keypad has the advantage of thin, slight, low noise, and low cost. Thus, the film keypad replaces the mechanical keypad and becomes more popular in the market.

Two detection methodologies to detect the key that user press are scan detection and interrupt detection respectively. The scan detection methodology exploits matrix topology to achieve the multi-key input purpose. The keypad manufacture has more flexibility when design the key of the keypad which has the larger amount of the key. So that most of film keypads in the market are using the scan detection methodology. In the conventional scan detection methodology, pull-up scan is the most common method in this field. FIG. 1a illustrates the conventional keypad circuit structure of the pull-up scan. The film keypad 10 in FIG. 1a has a matrix which crisscross-formed by a plurality of column signal lines 12 with a plurality of row signal lines 13. Each cross 14 formed by the column signal lines 12 and the row signal lines 13 has a switch S1, S2, S3, and S4, respectively. One terminal of each row signal lines 13 is electrically coupled to a micro controller unit (MCU) 11, and one terminal of each column signal 12 is electrically coupled to ground. FIG. 1b illustrates the simplified keypad circuit structure shown in FIG. 1a of the pull-up scan. As shown in FIG. 1b, the circuit in the keypad 10 just uses one switch S1 as an example for illustration purpose. In addition, column resistor Rcol and row resistor Rrow are used to indicate the column signal line and the row signal line respectively.

When the key corresponding to the switch S1 is pressed by the user, the switch S1 is turned on. To cooperate with the circuitry in the MCU 11 which includes a voltage source Vdd and a pull up resistor Rpu, the voltage Vio divided by column resistor Rcol and the row resistor Rrow can be detected according to the equation (1):

$$Vio = Vdd*(Rcol+Rrow)/(Rpu+Rcol+Rrow) \quad (1)$$

When the film material of the film keypad 10 is silver paste membrane which the resistance value is just about couple hundred ohms and the resistance of the pull up resistor Rpu is around couple kilo-ohms, the voltage level of Vio is quite closed to zero when the switch S1 is turned on. As a result, the voltage level of Vio is lower than the standard of the Schmitt trigger, wherein the predetermined trigger voltage of the Schmitt trigger is 0.2~0.4 times of the voltage source. Thus, it can scan all switches in the circuit of the keypad correctly. However, if the film material changes to carbon, the resistor resistance of the column resistor Rcol and the row resistor Rrow raise to couple hundred kilo-ohms, so that have to increase the resistance of the pull up resistor Rpu and/or the standard of the Schmitt trigger.

The material of the film is limited during the mass production due to the requirement of the resistance value of the pull up resistor Rpu and the standard of the Schmitt trigger, thus, the manufacturing need to adjust the resistor resistance of pull up resistor Rpu and/or the standard of Schmitt trigger accordingly.

SUMMARY

In one embodiment, wherein a key input apparatus and scanning method thereof is provided, it achieves the function of adapts the different film material by generating a pulse signal and detect the transformation of the pulse signal on the signal lines directly.

In one embodiment, wherein a key input apparatus includes a keypad device has a matrix crisscross formed by a plurality of first signal lines and a plurality of second signal lines, each cross of said matrix has a switch coupled to the adjacent said first signal line and said second signal line electrically, said keypad device further comprises a plurality of keys corresponded to said switch; and a micro controller unit couples said plurality of first signal lines and said plurality of second signal lines, said micro controller unit generates a pulse signal and transfers said pulse signal to said plurality of first signal lines and detects said plurality of second signal lines, wherein, hen said plurality of keys turn on a corresponding switch, said micro controller unit detects said pulse signal on said second signal line which transferred from said first signal line, wherein said first signal line and said second signal line are electrically coupled to said corresponding switch.

In one embodiment, wherein said micro controller unit transfers said pulse signal to said plurality of first signal lines based on a predetermined sequential and the phase of said pulse signal on said plurality of first signal lines are as the same as the phase of said pulse signal on said plurality of second signal lines. Wherein said switch is turned on when be pressed and is turned off when is released.

In one embodiment, wherein the scanning method of a key input apparatus of a keypad that is executed by a micro controller unit, an inner circuit of said keypad comprises a matrix crisscross formed by a plurality first signal lines and a plurality of second signal lines, each cross of said matrix has a switch coupled to adjacent said first signal line and said second signal line electrically, the scanning method includes a) generating a first signal, b) transferring said first signal to said plurality first signal lines based on a predetermined sequential and detecting whether a second signal exists on said plurality of second signal lines; and c) recording a corresponding cross which crisscrossed by a corresponding first signal line and a corresponding second signal line, wherein said corresponding first signal line transfers said first signal and said corresponding second signal line has said second signal on it thereof.

In one embodiment, wherein the scanning method further includes a step to determine the status of a corresponding switch on said corresponding cross, and a step to convert said corresponding cross to an address. Wherein, the phase of said second signal is as the same as the phase of said first signal and the threshold value is within a range between 20% of said pulse signal to 40% of said pulse signal.

Aforementioned, an embodiment in accordance with the present invention provides a key input apparatus and scanning method. The present invention provides a pulse signal to a first signal line and detects whether the pulse signal be transferred to a second signal line. By detecting the pulse signal directly, the present invention can reduce the impact cased by the resistance difference of the different film materials. Therefore, the present invention can identify the turned on switch immediately even under the different film material condition. Advantageously, the micro controller unit in the present invention adapts the resistance difference of the different film material without any modification or adjustment, and can achieve the function to adapt the different film material.

BRIEF DESCRIPTION OF THE DRAWINGS

Features and advantages of embodiments of the subject matter will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In order to flex the usage of the material of the film in the film keypad, or to prevent the adjustment of the resistor resistance of the pull up resistor Rpu and the adjustment of the standard of the Schmitt trigger which caused by the difference film material, a key input apparatus is disclosed. In one embodiment, the key input apparatus provides a pulse signal to the column signal lines 22 by the micro controller unit 21 within the keypad 20, and directly detect whether the row signal lines transfer the pulse signal or not. By detecting the transformation of the pulse signal, the micro controller unit 21 can identified the turned on switch, switch S1, from the plurality of switches S1~S4. Advantageously, the keypad 20 can confirm the turned on switch immediately without modify or adjust the micro controller unit 21 even with different resistor resistance of different film materials. As a result, the keypad 20 in accordance with the present invention adapts with different film materials.

Figure 1A:
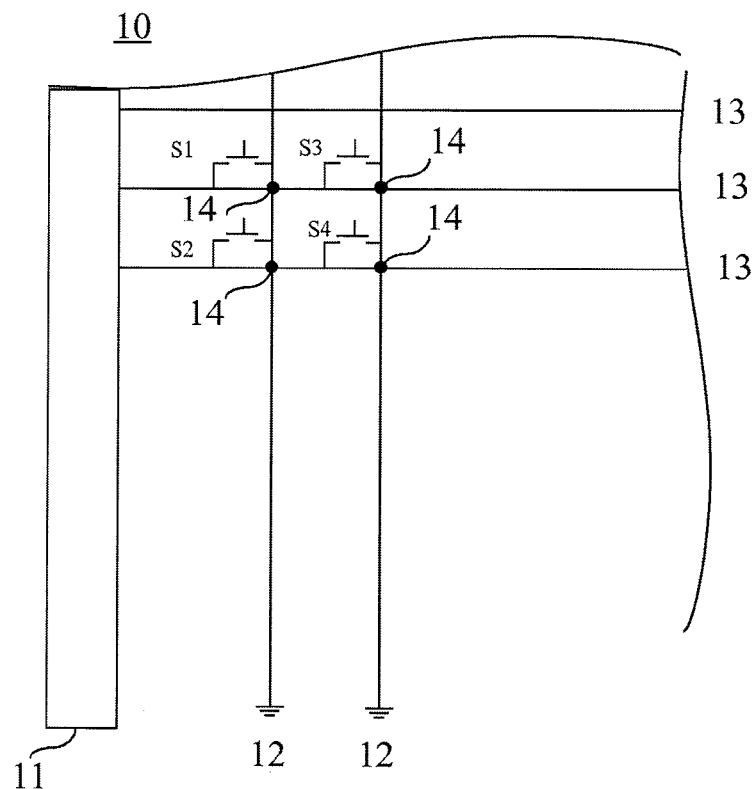
FIG. 1a illustrates the conventional keypad circuit structure of the pull-up scan.
Figure 1B:
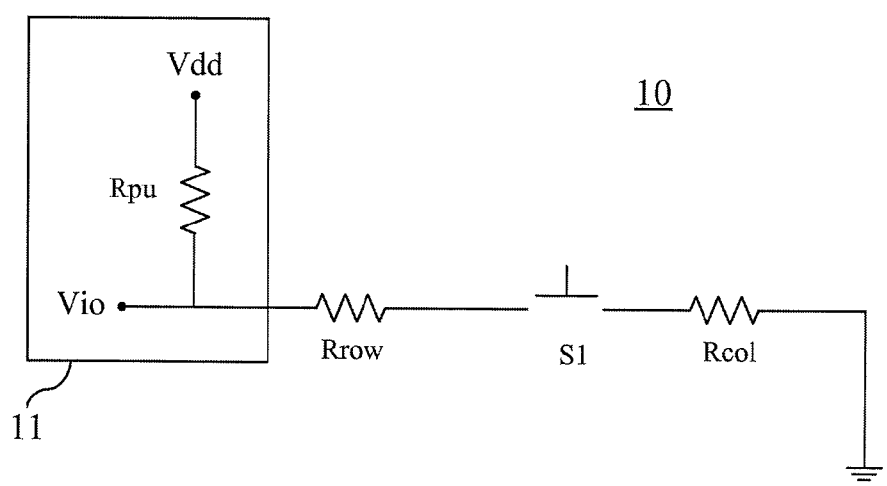
FIG. 1b illustrates the simplified keypad circuit structure shown in FIG. 1a of the pull-up scan.
Figure 2:
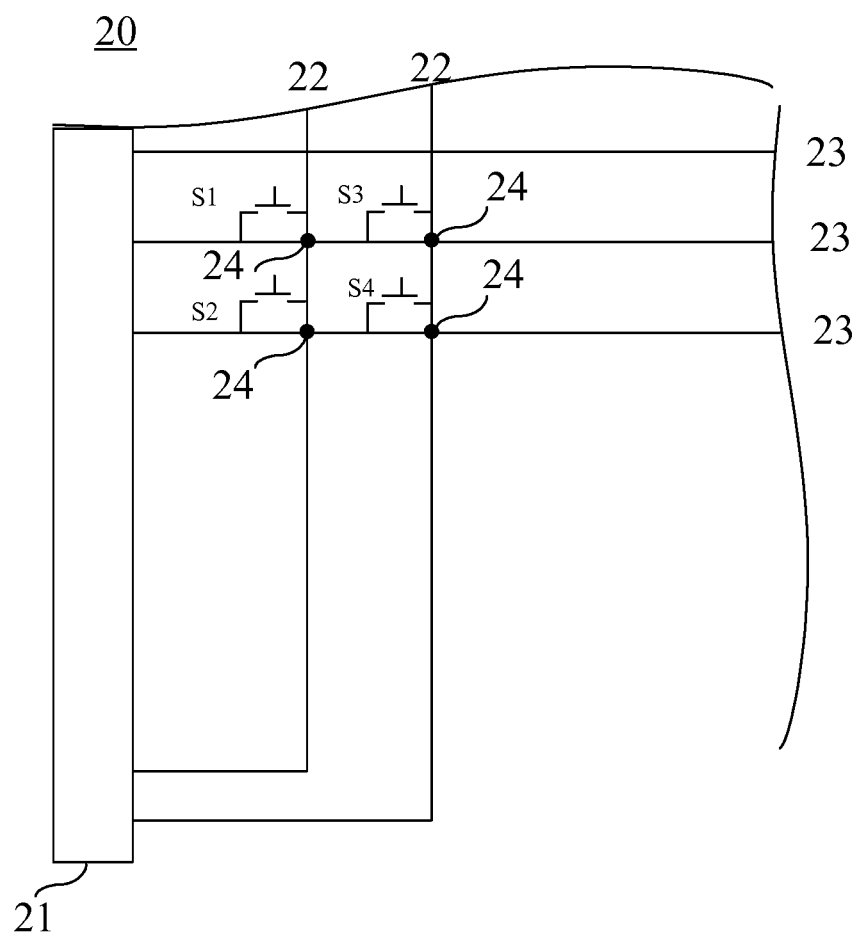
FIG. 2 illustrates a circuit structure of a key input apparatus, in accordance with one embodiment of the present invention.

FIG. 2 illustrates a circuit structure of a key input apparatus, in accordance with one embodiment of the present invention. Shown in FIG. 2, keypad 20 includes a key input device and a micro controller unit 21. The key input device includes matrix crisscrossed by a plurality of column signal lines 22 and a plurality of row signal lines 23. Each cross 24 has a switch S1~S4 electrically coupled to the adjacent column signal line 22 and the adjacent row signal line 23, and each cross 24 further includes a plurality of keys (not shown) corresponding to the switch. The micro controller unit 21 has a plurality of pins (not shown) electrically coupled to each column signal line 22 and row signal line respectively. The micro controller unit 21 generates a pulse signal to the column signal lines 22 in sequential order based on a predetermined sequence.

Figure 3A:
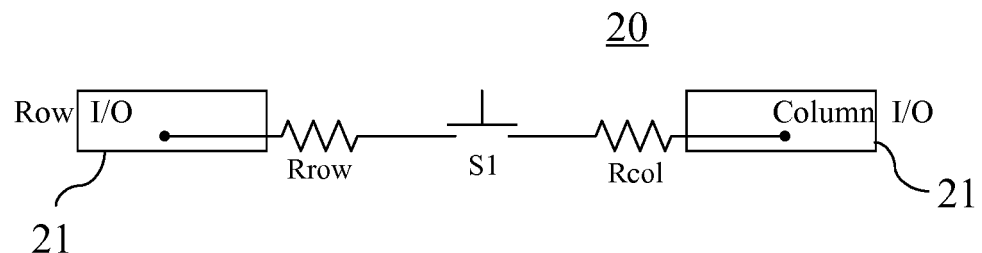
FIG. 3a illustrates a simplified circuit structure of the key input apparatus shown in FIG. 2, in accordance with one embodiment of the present invention.
Figure 3B:
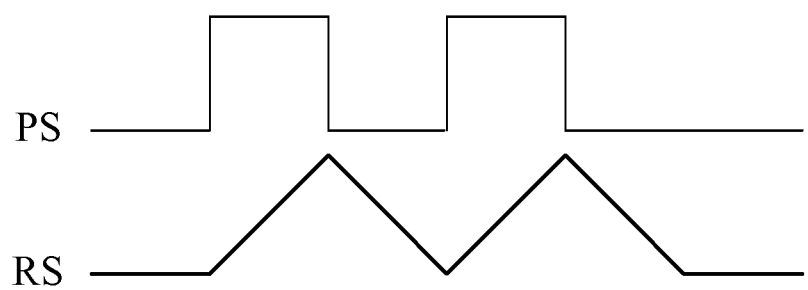
FIG. 3b illustrates a waveform of the pulse signal of the simplified circuit of the key input apparatus of FIG. 3a in accordance with one embodiment of the present invention.

FIG. 3a illustrates a simplified circuit structure of the key input apparatus shown in FIG. 2, in accordance with one embodiment of the present invention. For illustration purpose, a switch S1 is used to indicate the circuit in the keypad 20 and the column resistor Rcol and the row resistor Rrow are used to indicate the column signal lines 22, row signal lines 23, and the switch S2~S4. FIG. 3b illustrates a waveform of the pulse signal of the simplified circuit of the key input apparatus of FIG. 3a in accordance with one embodiment of the present invention. FIG. 3b is described in combination with FIG. 2 and FIG. 3a. In one embodiment, the micro controller unit 21 generates a pulse signal (PS) and sends the pulse signal PS to the column I/O terminal of the column resistor Rcol, wherein the column I/O terminals are the points connect the micro controller unit 21 and the column signal lines 22. The switch S1 turned on when the switch S1 is pressed by the stress due to the corresponding key of the switch S1 clicked by the user. And then the pulse signal PS be transferred through the switch S1 to the row resistor Rrow and output to the micro controller unit 21 via the row I/O terminal of the row resistor Rrow, wherein the row I/O terminals are the points connect the micro controller unit 21 and the row signal lines 23. As a result, the micro controller unit 21 can detect the signal RS on the row resistor Rrow, wherein the phase of the signal RS is as the same as the phase of the signal PS. When the user stop pressing/clicking the key, the switch S1 returns to the turn off status, accordingly, the pulse signal outputted from the column I/O terminal of the column resistor Rcol can not be transferred to the row resistor Rrow, thus, micro controller unit 21 detect no signal RS on the row resistor Rrow.

Figure 4:
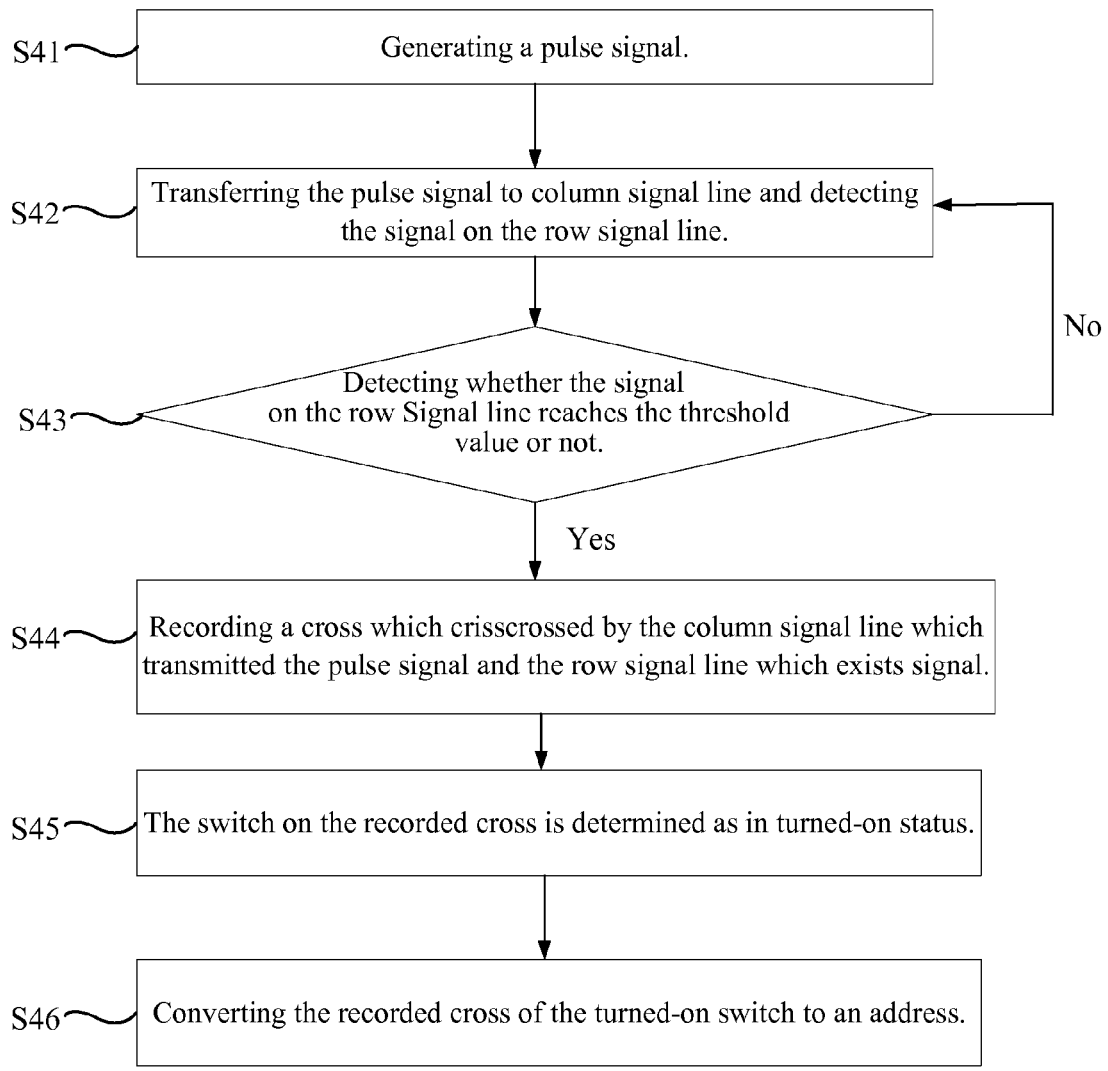
FIG. 4 illustrates a flowchart of the scan method operates by the key input apparatus in accordance with one embodiment of the present invention.

FIG. 4 illustrates a flowchart of the scan method operates by the keypad 20 shown in FIG. 2 in accordance with one embodiment of the present invention. In block S41, the micro controller unit 21 generates the pulse signal PS continuously. In block S42, the micro controller unit 21 transfers the pulse signal PS to the column signal line 22 based on the predetermined sequential, such as the sequence from the left to the right of the column signal lines 22. And, in the mean time, the micro controller unit 21 detects each of row signal lines 23 to check whether the signal RS exists on the row signal line 23 or not. In block S43, when the signal RS is detected, the micro controller unit 21 detected whether the voltage of the signal RS achieves a threshold value or not. If the voltage of the signal RS doesn't reach the threshold, the flowchart returns back to the block S42. Otherwise, if the voltage of the signal RS reaches the threshold, the flowchart goes to the block S44. Since each pin of the micro controller unit 21 electrically coupled to a column signal line 22 and a row signal line 23 respectively, the micro controller unit 21 records the cross 24 crisscrossed by the corresponding column signal line 22 and the corresponding row signal line 23 according to the signal RS received by which pin when the micro controller unit 21 detects the signal RS which is reaches the threshold value. In one embodiment, all switches S1~S4 are off when normal. In block S45, when the user presses the key of the keypad 20, the corresponding switch S1 is turned on, and the pulse signal PS on the column signal line 22 will be transfer to the row signal line 23 via the switch S1 and the signal RS can be detected on the row signal line 23. As a result, when the signal RS which reaches the threshold value detected by the micro controller unit 21, the switch S1 on the cross 24 which recorded by the micro controller unit 21 can be determined as in turned-on status. In the block S46, converting the cross 24 of the switch S1 to an address and transmit the information of the address to the computer and instruct the computer to execute the corresponding action.

More particularly, the predetermined sequential can be design according to different application or standard. In one embodiment, in block S42, the predetermined sequential is from left to right, but not limited to. The level of the threshold value can have different standard according to the type of the keypad. The level of the threshold value is lower for the keypad apparatus which has higher requirement of sensibility, and the level of the threshold value is higher for the keypad apparatus which has lower requirement of sensibility to avoid the malfunction. In the preferred embodiment, setting the maximum pulse signal PS as 100% and setting the threshold value within the range of 20% of the maximum pulse signal PS to 40% of the maximum pulse signal PS can provide user a good experience when using the keypad. Moreover, when the signal RS reaches the threshold value and detected by the micro controller unit 21, the detection process can be reset according to the different programming design. As a result, it can reduce the scanning time to scan all switch S1~S4. The pulse signal PS is inputted to the column I/O terminal and be transferred back to the micro controller unit 21 through the column resistor Rcol, the switch S1 in turn on status, and the row resistor Rrow, and identified as the signal RS by the micro controller unit 21. Thus, the phase of the signal RS is as the same as the phase of the pulse signal PS but the waveform of the signal RS is a little bit different from the pulse signal PS.

When the user release the key, the switch S1 returns to turn off status from the turn on status. Even the micro controller unit 21 provides the pulse signal PS to the column signal lines 22 continuously, the pulse signal PS can not be transferred to the row signal lines 23 via the switch S1 due to the switch S1 is under the turn off status, so as the signal RS will not exist on the row resistor Rrow and the micro controller unit 21 can not detect the signal RS on the row resistor Rrow. Then, the computer stops executing the corresponding action.

Accordingly, an embodiment in accordance with the present invention provides a key input apparatus and scanning method. The present invention provides a pulse signal to a first signal line and detects whether the pulse signal be transferred to a second signal line. By detecting the pulse signal directly, the present invention can reduce the impact cased by the resistance difference of the different film materials. Therefore, the present invention can identify the turned on switch immediately even under the different film material condition. Advantageously, the micro controller unit in the present invention adapts the resistance difference of the different film material without any modification or adjustment, and can achieve the function to adapt the different film material.

While the foregoing description and drawings represent embodiments of the present invention, it will be understood that various additions, modifications and substitutions may be made therein without departing from the spirit and scope of the principles of the present invention. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, and not limited to the foregoing description.

What is claimed is:

1. A key input apparatus, comprising:
   a keypad device having a matrix crisscross formed by a plurality of first signal lines and a plurality of second signal lines, each cross of said matrix having a switch coupled to adjacent said first signal line and said second signal line electrically, said keypad device further comprising a plurality of keys corresponded to said switch; and
   a micro controller unit coupling said plurality of first signal lines and said plurality of second signal lines, said micro controller unit configured to generate a pulse signal and configured to transfer said pulse signal to said plurality of first signal lines and configured to detect said plurality of second signal lines,
   wherein, when said plurality of keys turn on a corresponding switch, said micro controller unit detects said pulse signal on said second signal line which transferred from said first signal line, wherein said first signal line and said second signal line are electrically coupled to said corresponding switch.

2. The apparatus as claimed in claim 1, wherein said micro controller unit transfers said pulse signal to said plurality of first signal lines based on a predetermined sequential.

3. The apparatus as claimed in claim 1, wherein the phase of said pulse signal on said plurality of first signal lines is as the same as the phase of said pulse signal on said plurality of second signal lines.

4. The apparatus as claimed in claim 1, wherein said switch is turned on when be pressed and is turned off when be released.

5. The apparatus as claimed in claim 1, wherein said micro controller unit has a plurality of pins electrically coupled to each said plurality of first signal lines and each said plurality of second signal lines, respectively.

6. A scanning method of a key input apparatus of a keypad that is executed by a micro controller unit, an inner circuit of said keypad comprising a matrix crisscross formed by a plurality first signal lines and a plurality of second signal lines, each cross of said matrix having a switch coupled to the adjacent said first signal line and said second signal line electrically, the scanning method comprising:
   generating a first signal;
   transferring said first signal to said plurality first signal lines based on a predetermined sequential and detecting whether a second signal exists on said plurality of second signal lines; and
   recording a corresponding cross which crisscrossed by a corresponding first signal line and a corresponding second signal line, wherein said corresponding first signal line transfers said first signal and said corresponding second signal line having said second signal on it thereof.

7. The method as claimed in claim 6, wherein the phase of said second signal is as the same as the phase of said first signal.

8. The method as claimed in claim 6, wherein said step of detecting whether said second signal exists on said plurality of second signal lines comprises a step to detect said second signal reaches a threshold value or not.

9. The method as claimed in claim 8, wherein said threshold value is within a range between 20% of said pulse signal to 40% of said pulse signal.

10. The method as claimed in claim 6, further comprising:
 determining the status of a corresponding switch on said corresponding cross.

11. The method as claimed in claim 10, further comprising: converting said corresponding cross to an address.

* * * * *